United States Patent
Li et al.

(10) Patent No.: US 10,784,679 B2
(45) Date of Patent: Sep. 22, 2020

(54) ELECTROSTATIC DISCHARGE PROTECTION APPARATUS AND INTEGRATED CIRCUIT WITH MULTIPLE POWER DOMAINS

(71) Applicant: Huawei Technologies Co., Ltd., Shenzhen (CN)

(72) Inventors: Mei Li, Shenzhen (CN); Bingwu Ji, Shenzhen (CN); Yu Xia, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 328 days.

(21) Appl. No.: 15/687,252

(22) Filed: Aug. 25, 2017

(65) Prior Publication Data

US 2018/0062387 A1 Mar. 1, 2018

(30) Foreign Application Priority Data

Aug. 26, 2016 (CN) .......................... 2016 1 0739873

(51) Int. Cl.
*H02H 9/04* (2006.01)
*H01L 27/02* (2006.01)

(52) U.S. Cl.
CPC .......... *H02H 9/046* (2013.01); *H01L 27/0255* (2013.01); *H01L 27/0266* (2013.01); *H01L 27/0292* (2013.01)

(58) Field of Classification Search
CPC . H02H 9/046; H01L 27/0255; H01L 27/0266; H01L 27/0292

USPC .......................................................... 361/56
See application file for complete search history.

(56) References Cited

U.S. PATENT DOCUMENTS

| | | | |
|---|---|---|---|
| 5,903,419 A | 5/1999 | Smith | |
| 6,365,941 B1 | 4/2002 | Rhee | |
| 6,577,480 B1* | 6/2003 | Avery | ................. H01L 27/0255 361/111 |
| 2003/0133237 A1* | 7/2003 | Hung | ................. H01L 27/0266 361/56 |
| 2005/0231867 A1 | 10/2005 | Morishita | |
| 2006/0044718 A1* | 3/2006 | Su | ....................... H01L 27/0251 361/56 |
| 2006/0262472 A1* | 11/2006 | Okushima | ........... H01L 27/0251 361/91.1 |

(Continued)

FOREIGN PATENT DOCUMENTS

| | | |
|---|---|---|
| CN | 101378056 A | 3/2009 |
| CN | 103151769 A | 6/2013 |

(Continued)

*Primary Examiner* — Kevin J Comber
(74) *Attorney, Agent, or Firm* — Slater Matsil, LLP

(57) ABSTRACT

This application discloses an electrostatic discharge protection apparatus and an integrated circuit with multiple power domains. The electrostatic discharge protection apparatus includes a diode and an NMOS transistor. A positive electrode of the diode is coupled to a first interface, a negative electrode of the diode is coupled to a first electrode of the NMOS transistor, both a second electrode of the NMOS transistor and a gate electrode of the NMOS transistor are coupled to a second interface, and a substrate of the NMOS transistor is used for grounding. At least one electrostatic discharge protection apparatus may be disposed in the integrated circuit with multiple power domains.

20 Claims, 3 Drawing Sheets

(56) References Cited

U.S. PATENT DOCUMENTS

| | | | | |
|---|---|---|---|---|
| 2008/0067587 | A1* | 3/2008 | Gossner | H01L 21/84 |
| | | | | 257/336 |
| 2008/0080107 | A1* | 4/2008 | Chow | H01L 27/0251 |
| | | | | 361/56 |
| 2009/0059453 | A1 | 3/2009 | Arai et al. | |
| 2011/0205673 | A1* | 8/2011 | Okushima | H03K 19/003 |
| | | | | 361/56 |
| 2013/0033299 | A1* | 2/2013 | Goldstein | H03K 19/017509 |
| | | | | 327/333 |
| 2014/0217511 | A1* | 8/2014 | Katakura | H01L 27/0274 |
| | | | | 257/355 |
| 2015/0085407 | A1 | 3/2015 | Chen et al. | |
| 2017/0317070 | A1* | 11/2017 | Salcedo | H01L 24/49 |

FOREIGN PATENT DOCUMENTS

| | | |
|---|---|---|
| CN | 104465647 A | 3/2015 |
| KR | 20000021403 A | 4/2000 |
| KR | 20110097506 A | 8/2011 |
| TW | 200605348 A | 2/2006 |

\* cited by examiner

ELECTROSTATIC DISCHARGE PROTECTION APPARATUS AND INTEGRATED CIRCUIT WITH MULTIPLE POWER DOMAINS

CROSS-REFERENCE TO RELATED APPLICATIONS

This application claims priority to Chinese Patent Application No. 201610739873.3, filed on Aug. 26, 2016, which is hereby incorporated by reference in its entirety.

TECHNICAL FIELD

This application relates to the integrated circuit field, and in particular, to an electrostatic discharge protection apparatus and an integrated circuit with multiple power domains.

BACKGROUND

An integrated circuit with multiple power domains refers to an integrated circuit that includes multiple parts, and an independent power supply is used to supply power to each part. In the integrated circuit with multiple power domains, a part in which a same power supply is used to supply power may be referred to as a power domain, and parts in which different power supplies are used to supply power are referred to as different power domains. Each power domain may include multiple different circuit components, and different power domains may be connected to each other by using an interface of power domains (the interface of power domains), to implement signal transmission between power domains. Because different power supplies are separately used in different power domains to supply power, in a working process of a chip, if a power domain temporarily does not need to work, the integrated circuit powers off the power domain, thereby avoiding unnecessary power consumption generated by a circuit component in the power domain, and reducing overall power consumption of the chip.

Because different power supplies are separately used in different power domains to independently supply power, when there is an interface of power domains between two power domains, electrostatic discharge may occur between the two power domains, thereby damaging a circuit component. A common solution for reducing a circuit component damage risk caused by electrostatic discharge between power domains is: disposing a forward-biased diode between a signal input end of each power domain and a power supply of the power domain, to form an electrostatic charge leakage path. When electrostatic charges leak from another power domain connected to the signal input end of the power domain to the power domain by using an interface of power domains, the electrostatic charges may leak by using the charge leakage path that includes the diode, thereby reducing a circuit component damage risk caused by electrostatic discharge in the power domain.

However, because a signal input end of a power domain is usually connected to a signal output end of another power domain, if a diode is disposed between the signal input end and a power supply of the power domain, a path from a signal input end of the another power domain to the power supply of the power domain is formed. Therefore, when the power domain is powered off and the another power domain is not powered off, electric leakage from the another power domain to the power domain through the diode may occur, thereby generating unnecessary power consumption.

SUMMARY

This application provides an electrostatic discharge protection apparatus and an integrated circuit with multiple power domains, to reduce electric leakage from a powered on power domain to a powered off power domain.

According to a first aspect, this application provides an electrostatic discharge protection apparatus. The apparatus includes a diode and an N-channel metal oxide semiconductor (NMOS) transistor, where a positive electrode of the diode is coupled to a first interface. A negative electrode of the diode is coupled to a first electrode of the NMOS transistor. Both a second electrode of the NMOS transistor and a gate electrode of the NMOS transistor are coupled to a second interface. A substrate of the NMOS transistor is used for grounding. It should be noted herein that, the NMOS transistor may be replaced with another circuit component or circuit component combination that can implement NMOS transistor functions.

The first interface may be a signal input end of a power domain or a voltage source of the power domain. When the first interface is the signal input end of the power domain, the second interface is a voltage source of the power domain; or when the first interface is the voltage source of the power domain, the second interface is a signal input end of the power domain. The first electrode is a source electrode or a drain electrode of the NMOS transistor. When the first electrode is the source electrode of the NMOS transistor, the second electrode is the drain electrode of the NMOS transistor; or when the first electrode is the drain electrode of the NMOS transistor, the second electrode is the source electrode of the NMOS transistor.

Because the electrostatic discharge protection apparatus provided in this application includes a diode and an NMOS transistor, a circuit may be conductive when a voltage is relatively high, so as to implement electrostatic discharge protection. Alternatively, a circuit may be open when a voltage is relatively low, so as to reduce electric leakage when the voltage is low.

According to a second aspect, this application further provides an integrated circuit with multiple power domains, where a signal output end of a first power domain in the integrated circuit with multiple power domains is coupled to a signal input end of a second power domain in the integrated circuit with multiple power domains, and at least one electrostatic discharge protection apparatus described in the first aspect is coupled between the signal input end of the second power domain and a voltage source of the second power domain.

In the electrostatic discharge protection apparatus, a circuit may be conductive when a voltage is relatively high, so as to implement electrostatic discharge protection. Alternatively, a circuit may be open when a voltage is relatively low, so as to reduce electric leakage while electrostatic protection is implemented.

With reference to the second aspect, in a first possible implementation of the second aspect, that at least one electrostatic discharge protection apparatus described in the first aspect is coupled between the signal input end of the second power domain and a voltage source of the second power domain includes: the electrostatic discharge protection apparatus described in the first aspect is coupled between the signal input end of the second power domain and the voltage source of the second power domain; and a positive electrode of a diode in the electrostatic discharge protection apparatus is coupled to the voltage source of the second power domain, and a gate electrode of an NMOS transistor in the electrostatic discharge protection apparatus is coupled to the signal input end of the second power domain.

With reference to the second aspect, in a second possible implementation of the second aspect, that at least one electrostatic discharge protection apparatus described in the first aspect is coupled between the signal input end of the second power domain and a voltage source of the second power domain includes: the electrostatic discharge protection apparatus described in the first aspect is coupled between the signal input end of the second power domain and the voltage source of the second power domain; and a positive electrode of a diode in the electrostatic discharge protection apparatus is coupled to the signal input end of the second power domain, and a gate electrode of an NMOS transistor in the electrostatic discharge protection apparatus is coupled to the voltage source of the second power domain.

With reference to the second aspect, in a third possible implementation of the second aspect, that at least one electrostatic discharge protection apparatus described in the first aspect is coupled between the signal input end of the second power domain and a voltage source of the second power domain includes: a first electrostatic discharge protection apparatus and a second electrostatic discharge protection apparatus are coupled between the signal input end of the second power domain and the voltage source of the second power domain, where both the first electrostatic discharge protection apparatus and the second electrostatic discharge protection apparatus are electrostatic discharge protection apparatuses described in the first aspect; a positive electrode of a diode in the first discharge protection apparatus is coupled to the voltage source of the second power domain; a second electrode of a transistor in the first discharge protection apparatus is coupled to the signal input end of the second power domain; a positive electrode of a diode in the second discharge protection apparatus is coupled to the signal input end of the second power domain; and a second electrode of a transistor in the second discharge protection apparatus is coupled to the voltage source of the second power domain.

With reference to the second aspect or the first possible implementation of the second aspect, in a fourth possible implementation of the second aspect, the integrated circuit with multiple power domains is an integrated circuit with multiple power domains that is produced by using a fin field-effect transistor technique. Alternatively, the integrated circuit may be produced by using another technique.

With reference to the second aspect, in a fifth possible implementation of the second aspect, when the integrated circuit with multiple power domains includes more than two power domains, the first discharge protection apparatus and the second discharge protection apparatus may be disposed in each of the power domains.

In the electrostatic discharge protection apparatus and the integrated circuit with multiple power domains that are provided in this application, because the electrostatic discharge protection apparatus includes a diode and an NMOS transistor, a circuit may be conductive when a voltage is relatively high, so as to implement electrostatic discharge protection. Alternatively, a circuit may be open when a voltage is relatively low, so as to reduce electric leakage while electrostatic protection is implemented.

BRIEF DESCRIPTION OF THE DRAWINGS

To describe the technical solutions in this application more clearly, the following briefly describes the accompanying drawings required for describing the embodiments. Apparently, a person of ordinary skill in the art may still derive other drawings from these accompanying drawings without creative efforts.

DETAILED DESCRIPTION OF ILLUSTRATIVE EMBODIMENTS

Figure 1:
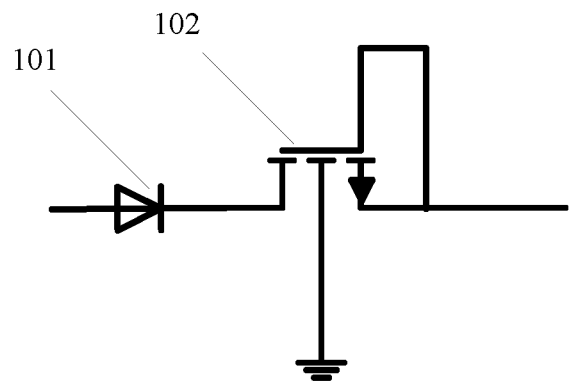
FIG. 1 is a schematic structural diagram of an embodiment of an electrostatic discharge protection apparatus in this application.

Referring to FIG. 1, FIG. 1 is a schematic structural diagram of an embodiment of an electrostatic discharge protection apparatus in this application. The apparatus may be applied to an integrated circuit, and in particular, to an integrated circuit that includes multiple power domains.

As shown in FIG. 1, the apparatus may include a diode 101 and an N-channel metal oxide semiconductor (NMOS for short) transistor 102.

A positive electrode of the diode 101 is coupled to a first interface of any power domain in the integrated circuit, and a negative electrode of the diode 101 is coupled to a first electrode of the NMOS transistor 102. The first interface is a signal input end of the power domain or a voltage source of the power domain. The first electrode is a source electrode or a drain electrode of the NMOS transistor 102. When the integrated circuit includes only one power domain, the power domain is the integrated circuit.

A substrate of the NMOS transistor 102 is used for grounding, and a second electrode of the NMOS transistor 102 is coupled to a gate electrode of the NMOS transistor 102. In addition to the gate electrode of the NMOS transistor 102, the second electrode of the NMOS transistor 102 is further coupled to a second interface of the power domain.

When the first interface is the signal input end of the power domain, the second interface is the voltage source of the power domain; or when the first interface is the voltage source of the power domain, the second interface is the signal input end of the power domain. When the first electrode is the source electrode of the NMOS transistor 102, the second electrode is the drain electrode of the NMOS transistor 102; or when the first electrode is the drain electrode of the NMOS transistor 102, the second electrode is the source electrode of the NMOS transistor 102. That is, when the negative electrode of the diode 101 is coupled to the source electrode of the NMOS transistor 102, the drain electrode of the NMOS transistor 102 is coupled to the gate electrode of the NMOS transistor 102; or when the negative electrode of the diode 101 is coupled to the drain electrode of the NMOS transistor 102, the source electrode of the NMOS transistor 102 is coupled to the gate electrode of the NMOS transistor 102.

The gate electrode of the NMOS transistor 102 is further coupled to the second interface of the power domain.

Therefore, when the drain electrode of the NMOS transistor 102 is coupled to the gate electrode of the NMOS transistor 102, the drain electrode of the NMOS transistor 102 is further coupled to the second interface; or when the source electrode of the NMOS transistor 102 is coupled to the gate electrode of the NMOS transistor 102, the source electrode of the NMOS transistor 102 is further coupled to the second interface.

Based on the foregoing electrostatic discharge protection apparatus, this application further provides an integrated circuit with multiple power domains. At least one electrostatic discharge protection apparatus is disposed in at least one power domain of the integrated circuit with multiple power domains.

Figure 2:
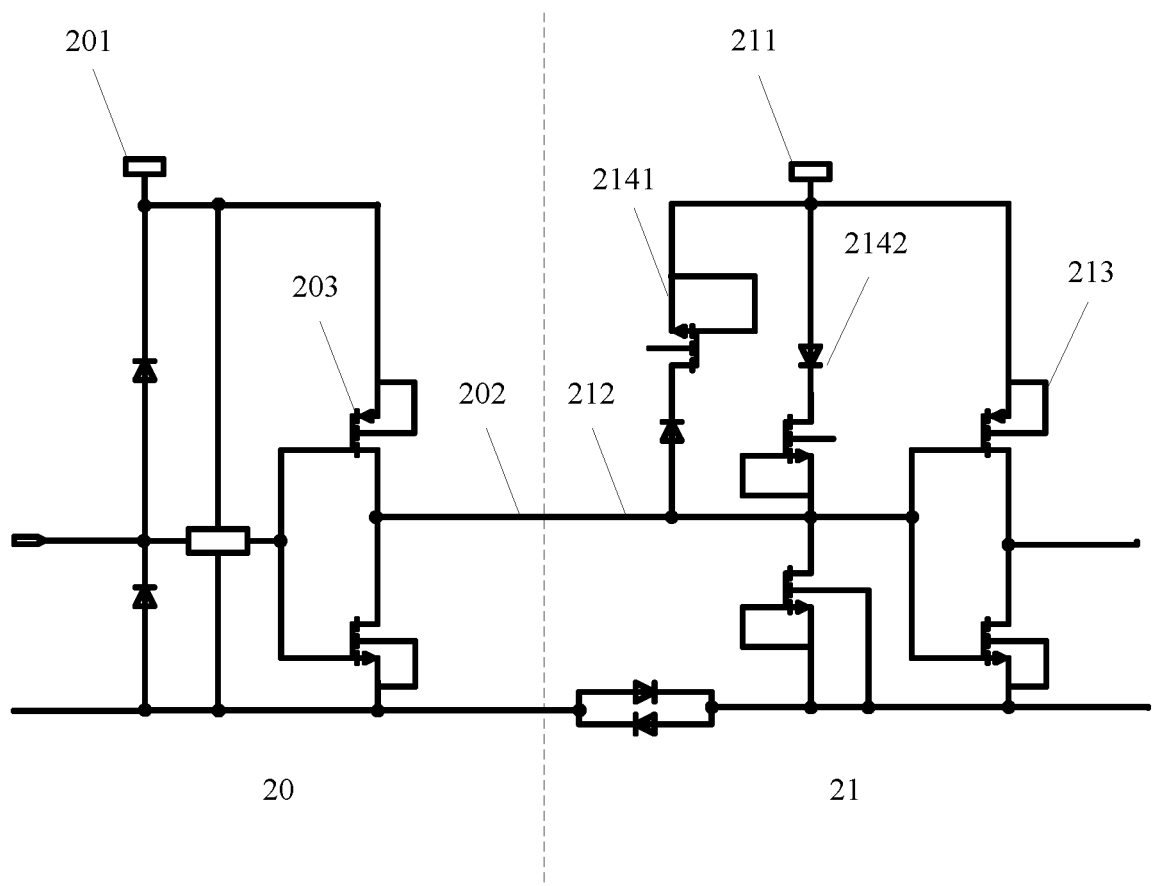
FIG. 2 is a schematic structural diagram of an embodiment of an integrated circuit with multiple power domains in this application.

Referring to FIG. 2, FIG. 2 is a schematic structural diagram of an embodiment of an integrated circuit with multiple power domains in this application.

As shown in FIG. 2, the integrated circuit with multiple power domains may include at least a first power domain 20 and a second power domain 21. In addition to the first power domain 20 and the second power domain 21, the integrated circuit with multiple power domains may further include more power domains. For ease of solution description, the power domains are not separately shown in the figure.

A power supply of the first power domain 20 is a first power supply 201, and the first power supply 201 may be usually a voltage source.

A signal output end 202 of the first power domain 20 is coupled to a signal input end 212 of the second power domain 21. The signal output end 202 may be an output end of an output drive circuit 203 in the first power domain 20. Although not specifically shown in the figure, the first power domain may further include a signal input end.

A power supply of the second power domain 21 is the second power supply 211, and the second power supply 211 may also be a voltage source. In addition, an output voltage of the first power supply 201 may be different from an output voltage of the second power supply 211.

The signal input end 212 of the second power domain 21 may be an input end of a receiver circuit 213 in the second power domain 21, and the receiver circuit 213 may include multiple sub-receiver circuits.

At least one electrostatic discharge protection apparatus may be coupled between the signal input end 212 of the second power domain 21 and the voltage source 211 of the second power domain 21. As shown in FIG. 2, a first electrostatic discharge protection apparatus 2141 and a second electrostatic discharge protection apparatus 2142 may be coupled between the signal input end 212 of the second power domain 21 and the voltage source 211 of the second power domain 21, and both the first electrostatic discharge protection apparatus 2141 and the second electrostatic discharge protection apparatus 2142 are electrostatic discharge protection apparatuses described in the foregoing embodiment.

As shown in FIG. 2, a positive electrode of a diode in the first electrostatic discharge protection apparatus 2141 is coupled to the signal input end 212 of the second power domain 21, and a gate electrode of an NMOS transistor in the first electrostatic discharge protection apparatus 2141 is coupled to the power supply 211 in the second power domain 21. A positive electrode of a diode in the second electrostatic discharge protection apparatus 2142 is coupled to the power supply 211 in the second power domain 21, and a gate electrode of an NMOS transistor in the second electrostatic discharge protection apparatus 2142 is coupled to the signal input end 212 of the second power domain 21.

In an example, the first electrostatic discharge protection apparatus 2141 and the second electrostatic discharge protection apparatus 2142 are coupled between the signal input end 212 of the second power domain 21 and the voltage source 211 of the second power domain 21.

When ESD charges forward leak from the first power domain 20 to the second power domain 21, the diode in the second electrostatic discharge protection apparatus 2142 is reverse-biased. Therefore, a breakdown voltage is extremely high. In this case, impedance of the diode in the second electrostatic discharge protection apparatus 2142 and the NMOS transistor in the second electrostatic discharge protection apparatus 2142 is extremely large, and the second electrostatic discharge protection apparatus 2142 is not open. The diode in the first electrostatic discharge protection apparatus 2141 and the NMOS transistor in the first electrostatic discharge protection apparatus 2141 are first conductive. Because the diode in the first electrostatic discharge protection apparatus 2141 is forward-biased, the NMOS transistor in the first electrostatic discharge protection apparatus 2141 is electrically broken down. Therefore, a voltage between the signal input end 212 of the second power domain 21 and the voltage source 211 of the second power domain 21 is clamped into a proper range, and a receiver circuit component coupled between the signal input end 212 of the second power domain 21 and the voltage source 211 of the second power domain 21 may not be irrecoverably damaged.

When ESD charges reversely leak from the first power domain 20 to the second power domain 21, the diode in the first electrostatic discharge protection apparatus 2141 is reverse-biased. Therefore, a breakdown voltage is extremely high. In this case, impedance of the diode in the first electrostatic discharge protection apparatus 2141 and the NMOS transistor in the first electrostatic discharge protection apparatus 2141 is extremely large, and the first electrostatic discharge protection apparatus 2141 is not conductive. The diode in the second electrostatic discharge protection apparatus 2142 and the NMOS transistor in the second electrostatic discharge protection apparatus 2142 are first conductive. Because the diode in the second electrostatic discharge protection apparatus 2142 is forward-biased, the NMOS transistor in the second electrostatic discharge protection apparatus 2142 is electrically broken down. Therefore, a voltage between the signal input end 212 of the second power domain 21 and the voltage source 211 of the second power domain 21 is clamped into a proper range, and a receiver circuit component coupled between the signal input end 212 of the second power domain 21 and the voltage source 211 of the second power domain 21 may not be irrecoverably damaged.

For example, as shown in FIG. 2, in the integrated circuit with multiple power domains, when ESD charges forward leak from the first power domain 20 to the second power domain 21, the second electrostatic discharge protection apparatus 2142 is not conductive, and the first electrostatic discharge protection apparatus 2141 clamps the voltage between the signal input end 212 of the second power domain 21 and the voltage source 211 of the second power domain 21 into a proper range. When ESD charges reversely leak from the first power domain 20 to the second power domain 21, the first electrostatic discharge protection apparatus 2141 is not conductive, and the second electrostatic discharge protection apparatus 2142 clamps the voltage between the signal input end 212 of the second power domain 21 and the voltage source 211 of the second power domain 21 into a proper range. Therefore, although some circuit components in the receiver circuit may still be electrically broken down, the circuit components in the receiver circuit are not damaged because the voltage is clamped into a specific range. Performance of the electrically broken down circuit components may return to normal after ESD energy is evacuated.

Figure 3:
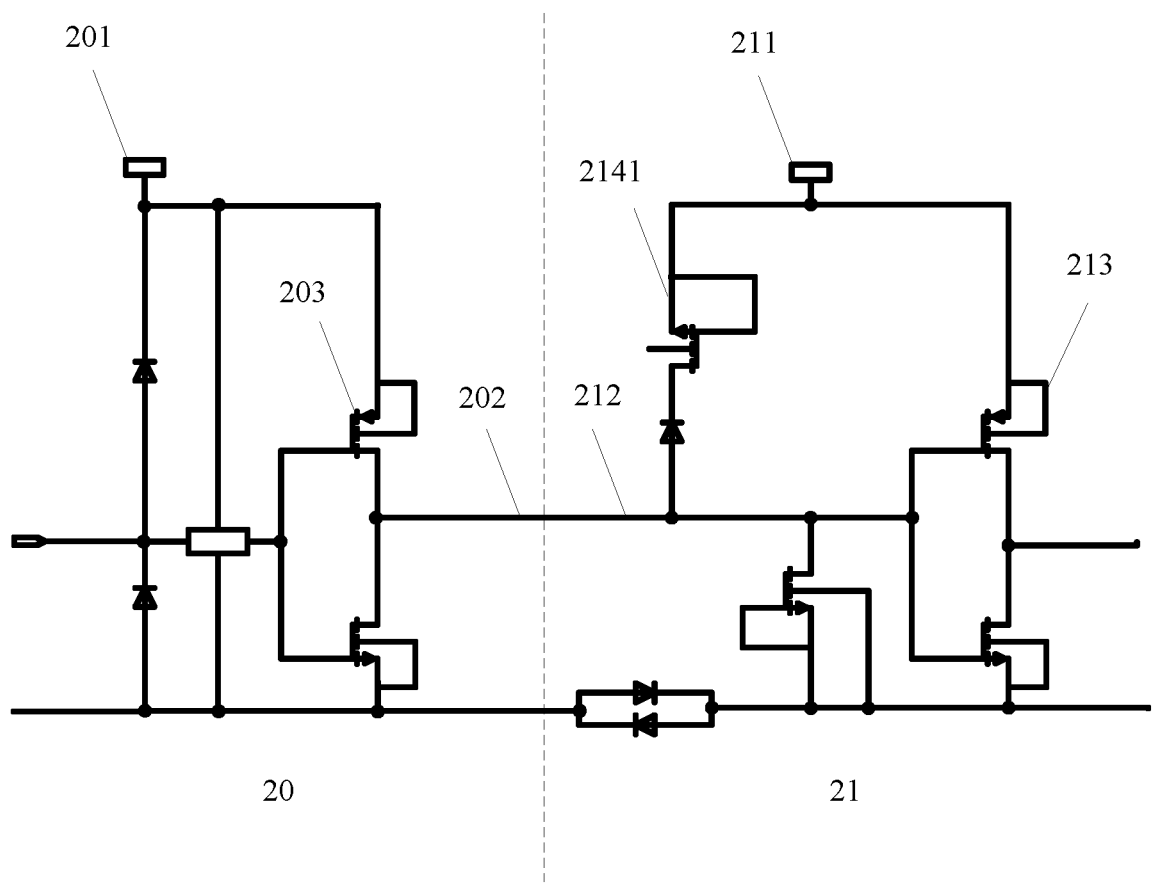
FIG. 3 is a schematic structural diagram of another embodiment of an integrated circuit with multiple power domains in this application.
Figure 4:
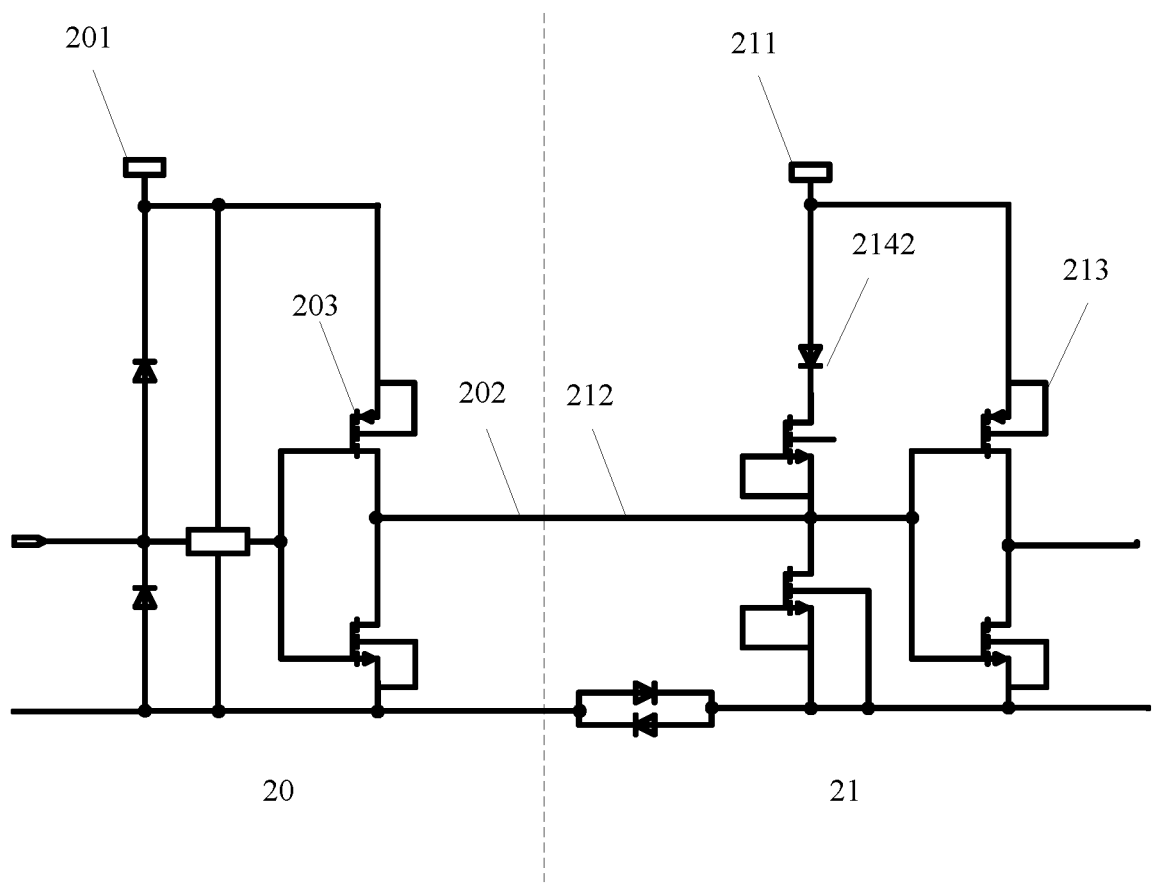
FIG. 4 is a schematic structural diagram of still another embodiment of an integrated circuit with multiple power domains in this application.

It should be noted herein that, if protection needs to be performed only when ESD charges forward leak from the first power domain 20 to the second power domain 21, as shown in FIG. 3, only the first electrostatic discharge protection apparatus 2141 may be coupled between the signal input end 212 of the second power domain 21 and the voltage source 211 of the second power domain 21. If protection needs to be performed only when ESD charges reversely leak from the first power domain 20 to the second power domain 21, as shown in FIG. 4, only the second electrostatic discharge protection apparatus 2142 may be coupled between the signal input end 212 of the second power domain 21 and the voltage source 211 of the second power domain 21.

In addition to the first electrostatic discharge protection apparatus 2141 and the second electrostatic discharge protection apparatus 2142, another circuit component may be coupled between the signal input end 212 of the second power domain 21 and the voltage source 211 of the second power domain 21.

For example, in addition to the first electrostatic discharge protection apparatus 2141 and the second electrostatic discharge protection apparatus 2142, multiple electrostatic discharge protection apparatuses described in the foregoing embodiment may be further coupled. Coupling manners of the electrostatic discharge protection apparatuses between the signal input end 212 of the second power domain 21 and the voltage source 211 of the second power domain 21 may be the same as that of the first electrostatic discharge protection apparatus 2141, or may be the same as that of the second electrostatic discharge protection apparatus 2142.

Mutual reference may be made to same or similar parts in the embodiments of this specification. Especially, an integrated circuit embodiment is basically similar to a method embodiment, and therefore is described briefly; for related pails, reference may be made to descriptions in the method embodiment.

The foregoing descriptions are implementations of the present application, but are not intended to limit the protection scope of the present application.

What is claimed is:

1. An integrated circuit, comprising:
   a plurality of power domains, wherein the plurality of power domains comprises a first power domain and a second power domain, and wherein a signal output end of the second power domain is coupled to a signal input end of the first power domain;
   a first apparatus coupled between the signal input end of the first power domain and a power supply voltage source of the first power domain, the first apparatus comprising:
   a first diode; and
   a first N-channel metal oxide semiconductor (NMOS) transistor;
   wherein a positive electrode of the first diode is coupled to the power supply voltage source of the first power domain;
   wherein a negative electrode of the first diode is coupled to a first electrode of the first NMOS transistor; and
   wherein both a second electrode of the first NMOS transistor and a gate electrode of the first NMOS transistor are coupled to the signal input end of the first power domain; and
   a second apparatus coupled between the signal input end of the first power domain and the power supply voltage source of the first power domain, the second apparatus comprising:
   a second diode; and
   a second NMOS transistor;
   wherein a positive electrode of the second diode is coupled to the signal input end of the first power domain;
   wherein a negative electrode of the second diode is coupled to a first electrode of the second NMOS transistor; and
   wherein both a second electrode of the second NMOS transistor and a gate electrode of the second NMOS transistor are coupled to the power supply voltage source of the first power domain.

2. The integrated circuit according to claim 1, wherein the integrated circuit is produced using a fin field-effect transistor technique.

3. The integrated circuit according to claim 1, wherein the first electrode of the first NMOS transistor is a source electrode of the first NMOS transistor and the second electrode of the first NMOS transistor is a drain electrode of the first NMOS transistor.

4. The integrated circuit according to claim 1, wherein the first electrode of the first NMOS transistor is a drain electrode of the first NMOS transistor and the second electrode of the first NMOS transistor is a source electrode of the first NMOS transistor.

5. The integrated circuit according to claim 1, wherein a substrate of the first NMOS transistor is used for grounding.

6. An integrated circuit, comprising:
   a plurality of power domains, wherein the plurality of power domains comprises a first power domain and a second power domain, and wherein a signal output end of the second power domain is coupled to a signal input end of the first power domain,
   a first apparatus coupled between the signal input end of the first power domain and a power supply voltage source of the first power domain, the first apparatus comprising:
   a first diode; and
   a first N-channel metal oxide semiconductor (NMOS) transistor;
   wherein a positive electrode of the first diode is coupled to the signal input end of the first power domain;
   wherein a negative electrode of the first diode is coupled to a first electrode of the first NMOS transistor; and
   wherein both a second electrode of the first NMOS transistor and a gate electrode of the first NMOS transistor are coupled to the power supply voltage source of the first power domain; and
   a second apparatus coupled between the signal input end of the first power domain and the power supply voltage source of the first power domain, the second apparatus comprising:
   a second diode; and
   a second NMOS transistor,
   wherein a positive electrode of the second diode is coupled to the power supply voltage source of the first power domain;

wherein a negative electrode of the second diode is coupled to a first electrode of the second NMOS transistor; and
wherein both a second electrode of the second NMOS transistor and a gate electrode of the second NMOS transistor are coupled to the signal input end of the first power domain.

7. The integrated circuit according to claim 6, further comprising:
a third apparatus, coupled between the signal input end of the first power domain and the power supply voltage source of the first power domain, comprising:
a third diode; and
a third NMOS transistor;
wherein a negative electrode of the third diode is coupled to a first electrode of the third NMOS transistor;
wherein a second electrode of the third NMOS transistor is coupled to a gate electrode of the third NMOS transistor; and
wherein, when the positive electrode of the third diode is coupled to the power supply voltage source of the first power domain, the second electrode of the third NMOS transistor is coupled to the signal input end of the first power domain, and when the positive electrode of the third diode is coupled to the signal input end of the first power domain, the second electrode of the third NMOS transistor is coupled to the power supply voltage source of the first power domain.

8. The integrated circuit according to claim 6, wherein a substrate of the first NMOS transistor is used for grounding.

9. The integrated circuit according to claim 6, wherein the integrated circuit is produced using a fin field-effect transistor technique.

10. The integrated circuit according to claim 6, wherein the first electrode of the first NMOS transistor is a source electrode of the first NMOS transistor and the second electrode of the first NMOS transistor is a drain electrode of the first NMOS transistor.

11. The integrated circuit according to claim 6, wherein the first electrode of the first NMOS transistor is a drain electrode of the first NMOS transistor and the second electrode of the first NMOS transistor is a source electrode of the first NMOS transistor.

12. An integrated circuit, comprising:
a first power domain, comprising a first interface;
a second power domain, comprising a second interface;
a signal path, disposed between the first interface and the second interface; and
a first apparatus coupled to the signal path and coupled to a power supply voltage source of the first power domain, the first apparatus comprising:
a first diode; and
a first N-channel metal oxide semiconductor (NMOS) transistor;
wherein a positive electrode of the first diode is coupled to a third interface;
wherein a negative electrode of the first diode is coupled to a first electrode of the first NMOS transistor; and
wherein both a second electrode of the first NMOS transistor and a gate electrode of the first NMOS transistor are coupled to a fourth interface; and
a second apparatus coupled to the signal path and coupled to the power supply voltage source of the first power domain, the second apparatus comprising:
a second diode; and
a second NMOS transistor;
wherein a positive electrode of the second diode is coupled to a fifth interface;
wherein a negative electrode of the second diode is coupled to a first electrode of the second NMOS transistor; and
wherein both a second electrode of the second NMOS transistor and a gate electrode of the second NMOS transistor are coupled to a sixth interface.

13. The integrated circuit according to claim 12, wherein:
the positive electrode of the first diode in the first apparatus is coupled to the power supply voltage source of the first power domain;
the gate electrode of the first NMOS transistor in the first apparatus is coupled to the signal path;
the positive electrode of the second diode in the second apparatus is coupled to the signal path; and
the gate electrode of the second NMOS transistor in the second apparatus is coupled to the power supply voltage source of the first power domain.

14. The integrated circuit according to claim 12, wherein:
the positive electrode of the first diode in the first apparatus is coupled to the signal path;
the gate electrode of the first NMOS transistor in the first apparatus is coupled to the power supply voltage source of the first power domain;
the positive electrode of the second diode in the second apparatus is coupled to the power supply voltage source of the first power domain; and
the gate electrode of the second NMOS transistor in the second apparatus is coupled to the signal path.

15. The integrated circuit according to claim 12, further comprising:
a third apparatus, comprising:
a third diode; and
a third NMOS transistor;
wherein a positive electrode of the third diode is coupled to the power supply voltage source of the first power domain;
wherein a negative electrode of the third diode is coupled to a first electrode of the third NMOS transistor; and
wherein both a second electrode of the third NMOS transistor and a gate electrode of the third NMOS transistor are coupled to the signal path.

16. The integrated circuit according to claim 12, further comprising:
a third apparatus, comprising:
a third diode; and
a third NMOS transistor;
wherein a positive electrode of the third diode is coupled to the signal path;
wherein a negative electrode of the third diode is coupled to a first electrode of the third NMOS transistor; and
wherein both a second electrode of the third NMOS transistor and a gate electrode of the third NMOS transistor are coupled to the power supply voltage source of the first power domain.

17. The integrated circuit according to claim 12, wherein a substrate of the first NMOS transistor is used for grounding.

18. The integrated circuit according to claim 12, wherein the integrated circuit is produced using a fin field-effect transistor technique.

19. The integrated circuit according to claim 12, wherein the first electrode of the first NMOS transistor is a source electrode of the first NMOS transistor and the second electrode of the first NMOS transistor is a drain electrode of the first NMOS transistor.

20. The integrated circuit according to claim 12, wherein the first electrode of the first NMOS transistor is a drain electrode of the first NMOS transistor and the second electrode of the first NMOS transistor is a source electrode of the first NMOS transistor.

\* \* \* \* \*